US011109497B2

(12) United States Patent  (10) Patent No.: US 11,109,497 B2
 Al-Banna  (45) Date of Patent: Aug. 31, 2021

(54) BACKWARD-COMPATIBLE EXTENDED SIZE NODE LID TO PROVIDE ADDITIONAL REAL ESTATE FOR FUTURE FUNCTIONALITY

(71) Applicant: ARRIS Enterprises LLC, Suwanee, GA (US)

(72) Inventor: Ayham Al-Banna, Orland Park, IL (US)

(73) Assignee: ARRIS Enterprises LLC, Suwanee, GA (US)

( * ) Notice: Subject to any disclaimer, the term of this patent is extended or adjusted under 35 U.S.C. 154(b) by 15 days.

(21) Appl. No.: 16/163,549

(22) Filed: Oct. 17, 2018

(65) Prior Publication Data

US 2020/0128685 A1   Apr. 23, 2020

(51) Int. Cl.
 *H05K 5/02* (2006.01)
 *H05K 5/03* (2006.01)
(52) U.S. Cl.
 CPC ......... *H05K 5/0239* (2013.01); *H05K 5/0226* (2013.01); *H05K 5/03* (2013.01)
(58) Field of Classification Search
 None
 See application file for complete search history.

(56) References Cited

U.S. PATENT DOCUMENTS

| 8,575,484 B1 | 11/2013 | Witherbee et al. |
| 2010/0226654 A1 | 9/2010 | Smith et al. |
| 2011/0318012 A1* | 12/2011 | Lonn ................ H04B 10/25751 398/115 |
| 2012/0312577 A1 | 12/2012 | Carbone et al. |
| 2017/0033544 A1 | 2/2017 | Coenegracht et al. |
| 2018/0284376 A1* | 10/2018 | Claessens ............ G02B 6/4471 |

FOREIGN PATENT DOCUMENTS

| JP | 2008-242460 | 10/2008 |
| JP | 2012-186665 | 9/2012 |

OTHER PUBLICATIONS

PCT/US2019/056716 International Search Report and Written Opinion.

\* cited by examiner

*Primary Examiner* — James Wu
*Assistant Examiner* — Christopher L Augustin
(74) *Attorney, Agent, or Firm* — Chernoff, Vilhauer, McClung & Stenzel, LLP

(57) ABSTRACT

A fiber optic node includes an electronics equipment enclosure. The electronics equipment enclosure includes a lid and a base defining an overall interior space of the electronics equipment enclosure. The lid includes a lid top and a lid mating surface to contact and overlap a base mating surface of the base to close the electronics equipment enclosure. The lid further includes at least one lid side wall extending away from the lid top. The at least one lid side wall includes at least one protruding lid side wall extending outwards to project beyond the lid mating surface. The base includes a base bottom and at least one base side wall extending away from the base bottom. The base further includes a base mating surface to contact and overlap the lid mating surface of the lid to close the electronics equipment enclosure.

20 Claims, 9 Drawing Sheets

OVERALL HFC SYSTEM BLOCK DIAGRAM

LAST HOP POTENTIAL TECHNOLOGIES DIAGRAM

BACKWARD-COMPATIBLE EXTENDED SIZE NODE LID TO PROVIDE ADDITIONAL REAL ESTATE FOR FUTURE FUNCTIONALITY

TECHNICAL FIELD

The examples described herein, in general, relate to electrical equipment enclosures to accommodate additional electrical equipment with enhanced heat dissipation, for example, a fiber optic node in a hybrid fiber coaxial (HFC) network.

BACKGROUND

An optical fiber network is a means of communication that uses signals encoded onto light to transmit information among various nodes of a telecommunications network. A HFC network is a type of hybrid optical fiber and coaxial network that combines optical fiber and coaxial cable. In an example HFC network, television channels are sent from the headend at the cable provider system's distribution facility to different communities through optical fiber subscriber lines connected to the HFC network.

In the HFC network, fiber optic cables connect the headend to numerous fiber optic nodes (optical nodes or fiber nodes for short). Each fiber optic node may serve about 25 to 2,000 homes. Current fiber optic nodes include electronics that are compatible with converged cable access platform (CCAP).

However, the cable industry is moving into a market bifurcation that requires adding more functionality, which means additional electronics need to be incorporated into fiber optic nodes. For example, future fiber optic nodes will need to accommodate various fiber optic network architectures or topologies, including remote physical layer (RPHY), medium access control physical layer (MAC-PHY), remote converged cable access platform (R-CCAP), remote optical line terminal (R-OLT), full duplex (FDX), etc. The foregoing technologies may fall under the umbrellas of distributed access architecture (DAA) or passive optical network (PON). Several of these technologies move physical and access layer functions in the access network to the fiber optic nodes from the headend, which means additional electrical or electronics equipment needs to be placed inside the fiber optic nodes.

Multiple challenges come with the adoption of these network architectures or topologies. For example, there is limited physical space inside the fiber optic node to accommodate the additional electrical or electronics equipment. One potential solution is to create new larger fiber optic nodes. However, multiple system operators (MSOs), which operate the cable television systems, prefer to keep existing installed fiber optic nodes in place because significant time, effort, and money is needed to replace already installed fiber optic nodes.

SUMMARY

According to the present disclosure, a larger real estate for an electronics equipment enclosure of the fiber optic node is provided for incorporating new electrical or electronics equipment, such as circuit boards, that provide functionality for new fiber optic node architectures and topologies. A new fiber optic node lid is designed which retrofits (e.g., is backward-compatible) with an existing fiber optic node base of the fiber optic node and expands the interior space of the fiber optic node to allow new optical, electrical, or electronics equipment to be installed within the interior space of the electronics equipment enclosure. The fiber optic node lid closes or mates tightly with the existing fiber optic node base and protrudes outwards to provide a larger surface area for a larger heat sink surface area to improve dissipation of excessive or unwanted heat from the newly installed electrical or electronics equipment. Larger real-estate provides large heat sinks inside and dissipates more heat. The fiber optic node lid can be casted (e.g., molded) as a single integral piece or multiple pieces (e.g., two or more pieces).

In a first example, a fiber optic node includes an electronics equipment enclosure. The electronics equipment enclosure includes a lid and a base defining an overall interior space of the electronics equipment enclosure. The fiber optic node further includes an optical transceiver mounted within the overall interior space of the electronics equipment enclosure. The lid includes a lid top and a lid mating surface to contact and overlap a base mating surface of the base to close the electronics equipment enclosure. The lid further includes at least one lid side wall extending away from the lid top. The at least one lid side wall includes at least one protruding lid side wall extending outwards to project beyond the lid mating surface. The lid top, the at least one lid side wall, and the lid mating surface define a lid interior space of the lid. The base includes a base bottom and at least one base side wall extending away from the base bottom. The base further includes a base mating surface to contact and overlap the lid mating surface of the lid to close the electronics equipment enclosure. The base bottom, the at least one base side wall, and the base mating surface define a base interior space of the base. The lid interior space can be greater than the base interior space, in some examples.

In a second example, an electronics equipment enclosure includes a lid and a base defining an overall interior space of the electronics equipment enclosure. The lid includes a lid top and a lid mating surface to contact and overlap a base mating surface of the base to close the electronics equipment enclosure. The lid further includes at least one lid side wall extending away from the lid top. The at least one lid side wall includes at least one protruding lid side wall extending outwards to project beyond the lid mating surface. The base includes a base bottom and at least one base side wall extending away from the base bottom. The base further includes the base mating surface to contact and overlap the lid mating surface of the lid to close the electronics equipment enclosure.

In a third example, a fiber optic node includes an electronics equipment enclosure including a lid and a base defining an overall interior space of the electronics equipment enclosure. The fiber optic node further includes electronics equipment mounted within the interior space of the electronics equipment enclosure. The lid includes a lid top and a lid mating surface to contact and overlap a base mating surface of the base to close the electronics equipment enclosure. The lid further includes at least one lid side wall extending away from the lid top. The at least one lid side wall includes at least one protruding lid side wall extending outwards to project beyond the lid mating surface. The base includes a base bottom and at least one base side wall extending away from the base bottom. The base further includes the base mating surface to contact and overlap the lid mating surface of the lid to close the electronics equipment enclosure.

In a fourth example, a method of installing a new lid on an electronics equipment enclosure includes removing a legacy lid attached to a base of the electronics equipment enclosure while the base remains connected to a cable. The base includes previously installed electronics equipment disposed therein. The method further includes attaching a new lid to the base of the electronics equipment enclosure while the base remains connected to the cable. The new lid includes a lid top and a lid mating surface to contact and overlap a base mating surface of the base to close the electronics equipment enclosure. The new lid further includes at least one lid side wall extending away from the lid top, the at least one lid side wall including at least one protruding lid side wall extending outwards to project beyond the lid mating surface. The new lid further includes an interior space defined by the lid top, the at least one lid side wall, and the lid mating surface. The new lid further includes new electronics equipment mounted in the interior space. The method further includes electrically connecting the new electronics equipment to the previously installed electronics equipment of the base.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF THE DRAWINGS

The figures depict one or more implementations in accordance with the present teachings by way of example only, not by way of limitation. In the figures, like reference numbers refer to the same or similar elements.

DETAILED DESCRIPTION

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high level, without detailed comment in order to avoid unnecessarily obscuring aspects of the present teachings.

Communications over the HFC network utilize signals encoded into a light beam to transmit information among various nodes of the HFC network. At the headend, various services are encoded, modulated and up converted onto radio frequency (RF) carriers, combined onto a single electrical signal, and inserted into a broadband optical transmitter at the headend. The broadband optical transmitter converts the electrical signal to a downstream optically modulated signal that is sent over the HFC network.

Figure 1:
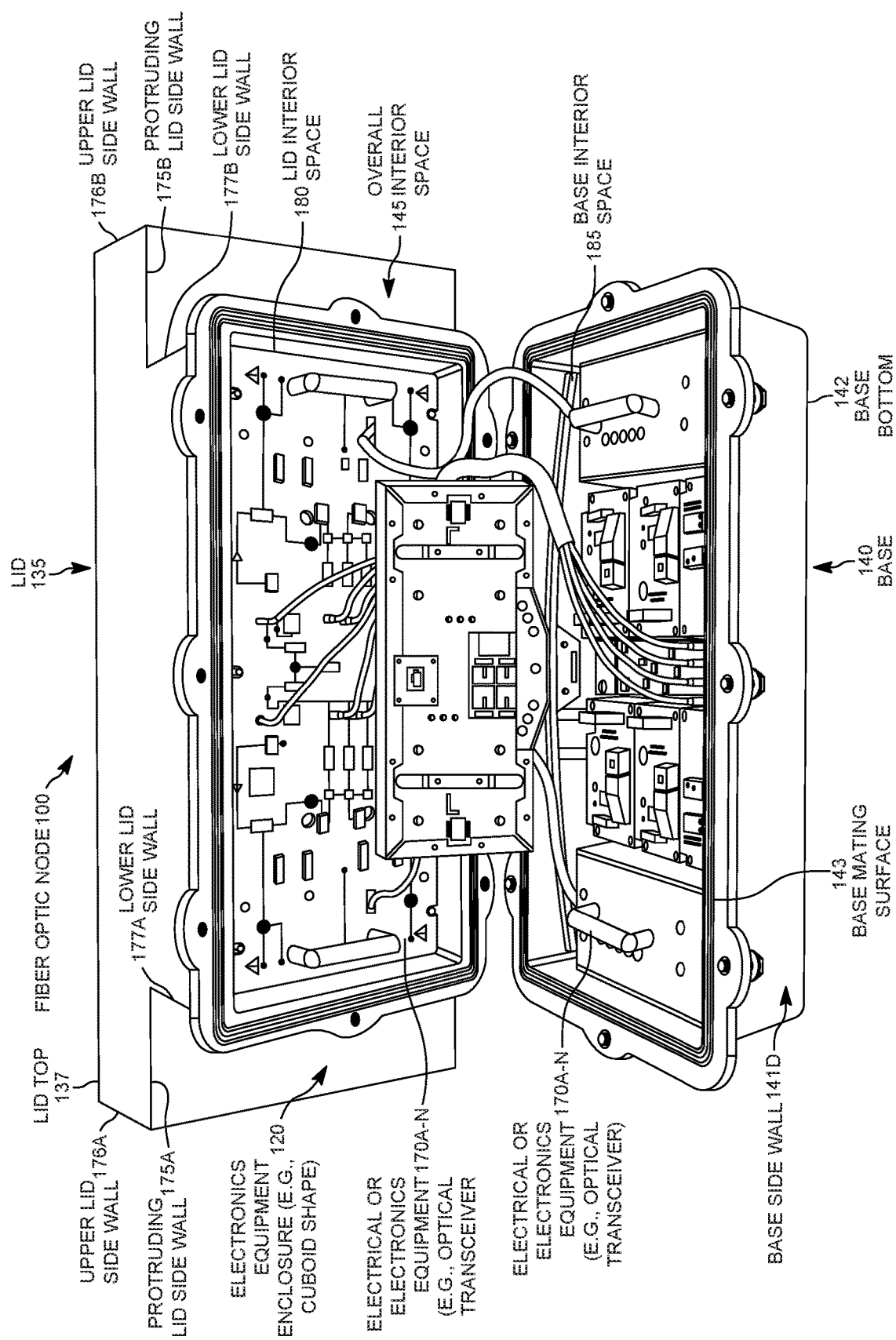
FIG. 1 is an isometric view of a fiber optic node in an open state, which includes an electronics equipment enclosure having an optical transceiver mounted within an interior space and protruding lid side walls extending outwards to project beyond a lid mating surface.

Shown in the diagram of FIG. 1 is an isometric view of a fiber optic node 100 in an open state. Each local community connected to the HFC network may connect via such a fiber optic node 100. Each fiber optic node 100 is connected to the main fiber optic transmission cable. The fiber optic node 100 has an optical transceiver 170A. Optical transceiver 170A includes an optical receiver that converts the signals received over the stub fiber optic cable from a light beam into electrical signals, and sends the converted electrical signals over coaxial cable lines for distribution to subscriber residences. Optical transceiver 170A also includes a return path optical transmitter that sends communication from the homes back to the headend by converting electrical signals into optical signals.

Fiber optic node 100 includes an electronics equipment enclosure 120. Electronics equipment enclosure 120 includes a lid 135 and a base 140 defining an overall interior space 180 of the electronics equipment enclosure 120. Lid 135 and base 140 are removably attached to each other. By retrofitting the lid 135 that includes protruding lid side walls 175A-B, previously installed fiber optic nodes that are box shaped (e.g., rectangular prisms) can increase heat sinking area and accommodate additional electrical or electrical equipment 170A-N for newer HFC network topologies and architectures.

Hence, fiber optic node 100 further includes various electrical or electronics equipment 170A-N, such as circuit boards (e.g., optical transceiver 170A) mounted or otherwise stored inside the overall interior space 180 of the electronics equipment enclosure 120. Electrical or electronics equipment 170A-N can include various printed circuit boards (PCBs) that mechanically support and electrically connect electronic components or electrical components stored inside the overall interior space 145 using conductive tracks, pads, and other features etched from one or more sheet layers of copper laminated onto and/or between sheet layers of a non-conductive substrate. Components are generally soldered onto the PCB to both electrically connect and mechanically fasten them to the PCB.

As shown, fiber optic node 100 includes an electronics equipment enclosure 120 with the optical transceiver 170A disposed inside. The electronics equipment enclosure 120 can have a cylinder, cone, sphere, or ellipsoid shape; however, in the example of FIG. 1, the electronics equipment enclosure 120 is a non-cuboid polyhedron shape (e.g., not a rectangular prism) with rounded corners on lid 135 and base 140. If the electronics equipment enclosure 120 has a curved shape (e.g., cylinder, cone, sphere, or ellipsoid shape), for example, then the lid 135 of the electronics equipment enclosure 120 has a single lid side wall with a continuous surface, instead of several intersecting lid side walls with discontinuous surfaces as shown in FIG. 1. A continuous surface or wall (e.g., curved surface) can form an ellipsoid, spheroid, cone, paraboloid, or hyperboloid that may be truncated at one or both ends. Hence, the lid 135 of the electronics equipment enclosure 120 generally includes at least one lid side wall.

Lid includes a lid top 137 and a lid mating surface 138 to contact and overlap a base mating surface 143 of the base 140 to close the electronics equipment enclosure 120. Both lid mating surface 138 and the base mating surface 143 are quadrilateral ringed shaped surfaces with rounded corners. In FIG. 1, lid 135 has a non-cuboid shaped polyhedron shape and can include rounded corners on the surfaces of the set of lid side walls. Base 140 has a cuboid polyhedron shape (e.g., rectangular prism) with rounded corners. However, in some examples, the lid 135 may include various curved surfaces, such as to have a cylindrical, conical, spherical, or elliptical shape as described. For example, a single continuous protruding lid wall 175 extending from the lid mating surface 138 and abutting the lid top 137 may have an inverted truncated cone shape in which the lid mating surface 138 truncates the tip of the cone.

Lid 135 further includes at least one lid side wall extending away from the lid top 137. As used herein, unless otherwise stated, the phrase "extending away" when referring to lid or base side walls means extending upwards, extending downwards, protruding outwards, or projecting inwards. As further described in FIGS. 4-8 below, the lid 135 can include one continuous protruding lid side wall 175 or a set of discontinuous lid side walls. In the example of FIG. 1, the lid 135 shown is like that depicted in FIGS. 4-5. Hence, the at least one lid side is a set of lid side walls, which includes protruding lid side walls 175A-B, upper lid side walls 176A-B, lower lid side walls 177A-B, and top-top-bottom side walls 178A-B. The at least one lid side wall includes at least one protruding lid side wall 175A-B extending outwards to project beyond the lid mating surface 138. Two protruding side walls 175A-B are shown in FIG. 1. Lid top 137, the at least one lid side wall (e.g., set of lid side walls), and the lid mating surface 138 define a lid interior space 180 of the lid 135.

As further described in FIG. 3 below, base 140 includes a base bottom 142 and at least one base side wall extending away from the base bottom 142. The base 140 can include one continuous base side wall 141 or a set of discontinuous base side walls. In FIG. 1, there are four discontinuous base side walls 141A-D, of which base side wall 141D is labeled. In the example of FIG. 1, the base 140 is like that depicted in further detail in FIG. 3. Hence, the at least one base side wall includes a set of base side walls 141A-D. Base 140 further includes a base mating surface 143 to contact and overlap the lid mating surface 138 of the lid 135 to close the electronics equipment enclosure 120. Base bottom 142, the at least one base side wall (e.g., set of base side walls 141A-D), and the base mating surface 143 define a base interior space 185 of the base 140. Lid interior space 180 is greater than the base interior space 185.

Figure 2:
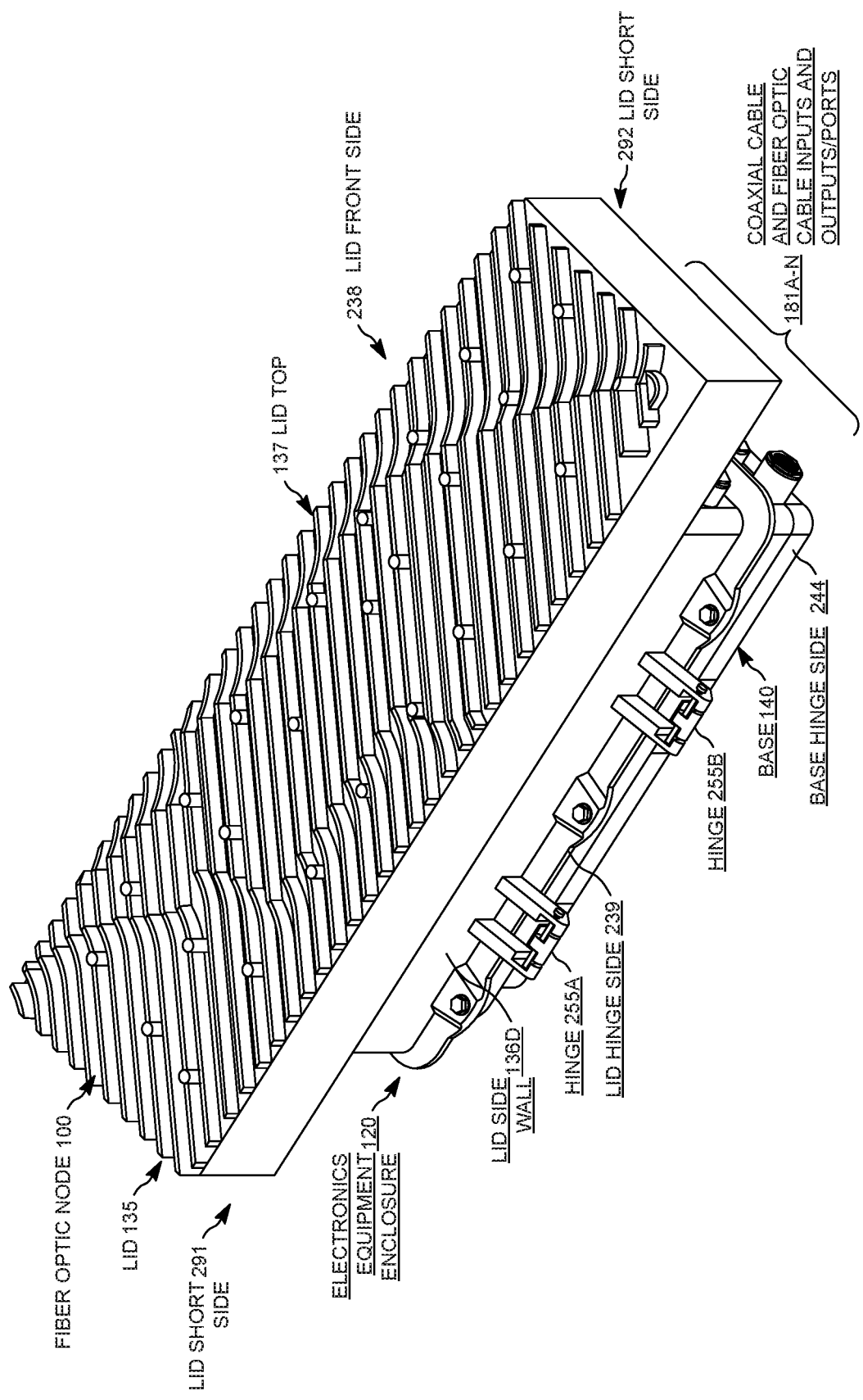
FIG. 2 is another isometric view of the fiber optic node of FIG. 1 in a closed state in which a lid and a base of the electronics equipment enclosure are mated together.

FIG. 2 is another isometric view of the fiber optic node 100 of FIG. 1 in a closed state, in which the lid 135 and the base 140 of the electronics equipment enclosure 120 are mated together. As noted above, the optical transceiver 170A inside the electrical or electronics equipment 170A-N includes an optical transmitter mounted within the overall interior space 145 of the electronics equipment enclosure 120 to convert electrical signals conveyed via a coaxial cable into optical signals for upstream transmission via a fiber optic cable. Optical transceiver 170A further includes an optical receiver mounted within the overall interior space 145 of the electronics equipment enclosure 120 to convert optical signals conveyed via the fiber optic cable into electrical signals for downstream transmission via the coaxial cable. As shown in FIG. 2, for such purposes, the fiber optic node 100 includes various coaxial cable and fiber optic cable inputs and outputs/ports 181A-N.

As further shown, lid 135 includes a lid front side 238 and a lid hinge side 239 that opposes the lid front side 238, which are shown on opposing long sides of the lid 135. Base 140 includes a base front side 248 and base hinge side 244 that opposes the base front side 248, which are shown on opposing long sides of the base 140. Lid 135 further includes two opposing lid short sides 291-292, which are shown on opposing short sides of the lid 135. Base 140 also includes two opposing base short sides (unlabeled), which are on opposing short sides of the base 140.

Electronics equipment enclosure includes two hinges 255A-B located on the base hinge side 244 and lid hinge side 239 to affix lid 135 and base 140 to removably attach the lid 135 and the base 140 to each other on a somewhat permanent basis after retrofitting. Electronics equipment enclosure 120 also includes various screws and nuts coupled to various portions of the lid mating surface 138 and the base mating surface 143, which removably attach lid mating surface 138 to the base mating surface 143 on a more temporary basis to allow for servicing of the fiber optic node 100. For example, screws and nuts can be coupled to various openings in lid mating surface 138 of lid front side 238 and base mating surface 142 of base front side 248 to removably attach lid 135 to base 140. Screws and nuts can also be coupled to various openings in lid mating surface 138 of lid hinge side 239 and base mating surface 142 of base hinge side 244 to removably attach lid 135 to base 140.

When hinges 255A-B are engaged on lid hinge side 239 and base hinge side 244 along with the various screws and nuts in openings through the lid mating surface 138 and base mating surface 143, the electronics equipment enclosure 120 is in a closed state. To retrofit lid 135 with base 140 of the electronics equipment enclosure 120, hinges 255A-B are disengaged on lid hinge side 239 and base hinge side 244 and screws and nuts are disengaged from various openings in lid mating surface 138 and base mating surface 143. Electrical or electronics equipment 170A-N is mounted inside the lid interior space 180 of the lid 135, for example, to provide circuitry and software logic to accommodate new network architectures and topologies of the HFC network. For example, the optical transceiver 170A is disposed inside the lid 135. Optical transceiver 170A includes an optical transmitter mounted within the overall interior space 145, such as lid interior space 180, of the electronics equipment enclosure 120 to convert electrical signals conveyed via a coaxial cable into optical signals for upstream transmission via a fiber optic cable. Optical transceiver 170A further includes an optical receiver mounted within the interior space 145, such as lid interior space 180, of the electronics equipment enclosure 120 to convert optical signals conveyed via the fiber optic cable into electrical signals for downstream transmission via the coaxial cable. After retrofitting the fiber optic node 100 with the lid 135, hinges 255A-B are typically not disengaged during servicing of the fiber optic node 100. Instead, servicing of the fiber optic node 100 after installation can be achieved by merely removing screws and nuts from openings in lid mating surface 138 and base mating surface 143.

Figure 3:
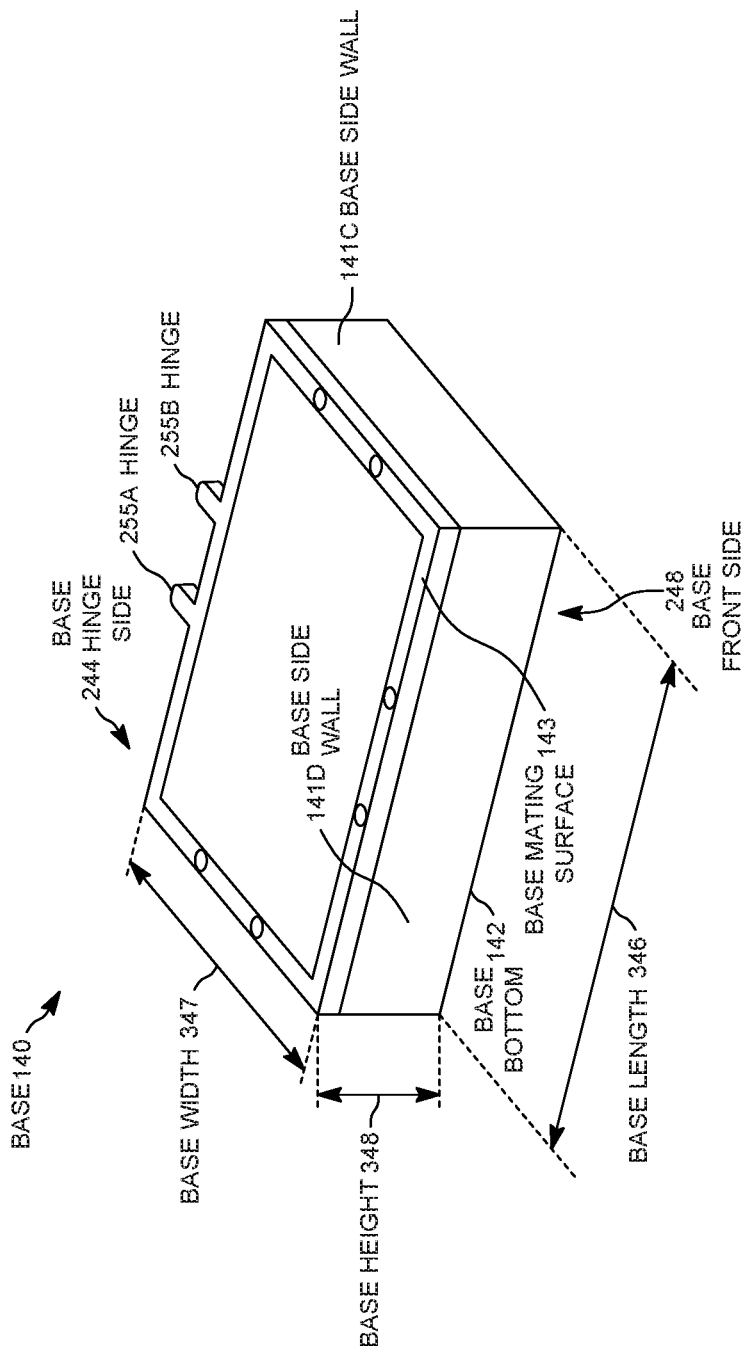
FIG. 3 is a front perspective view of the base of the electronics equipment enclosure of FIGS. 1-2, showing base side walls and a base mating surface.

FIG. 3 is a front perspective view of the base 140 of the electronics equipment enclosure 120 of FIGS. 1-2, showing base side walls 141A-D and a base mating surface 143. As shown, the base 140 has a cuboid polyhedron shape. The at least one base side wall includes a set of base side walls 141A-D. Set of base side walls 141A-D includes four quadrilateral base side walls 141A-D with rounded corners, and two of the base side walls 141C-D are visible in FIG. 3. Each of the base side walls 141A-D have four outer edges that define a square, rectangular, or other quadrilateral shape and may include rounded corners. Base 140 has a base bottom 142 and base side walls 141A-D. Base side walls 141A-D extend upwards from outer boundaries of the base bottom 142 to abut (e.g., touch or border) the base mating surface 143.

As shown, a base height 348 of the base 140 spans a first distance from the base mating surface 143 downwards to the base bottom 142. Base length 346 of the base 140 spans a second distance from two opposing base short sides of the base mating surface 143. Base width 347 of the base 140 spans a third distance between base front side 248 and base hinge side 244, such as from two opposing base long sides of the base mating surface 143.

Figure 4:
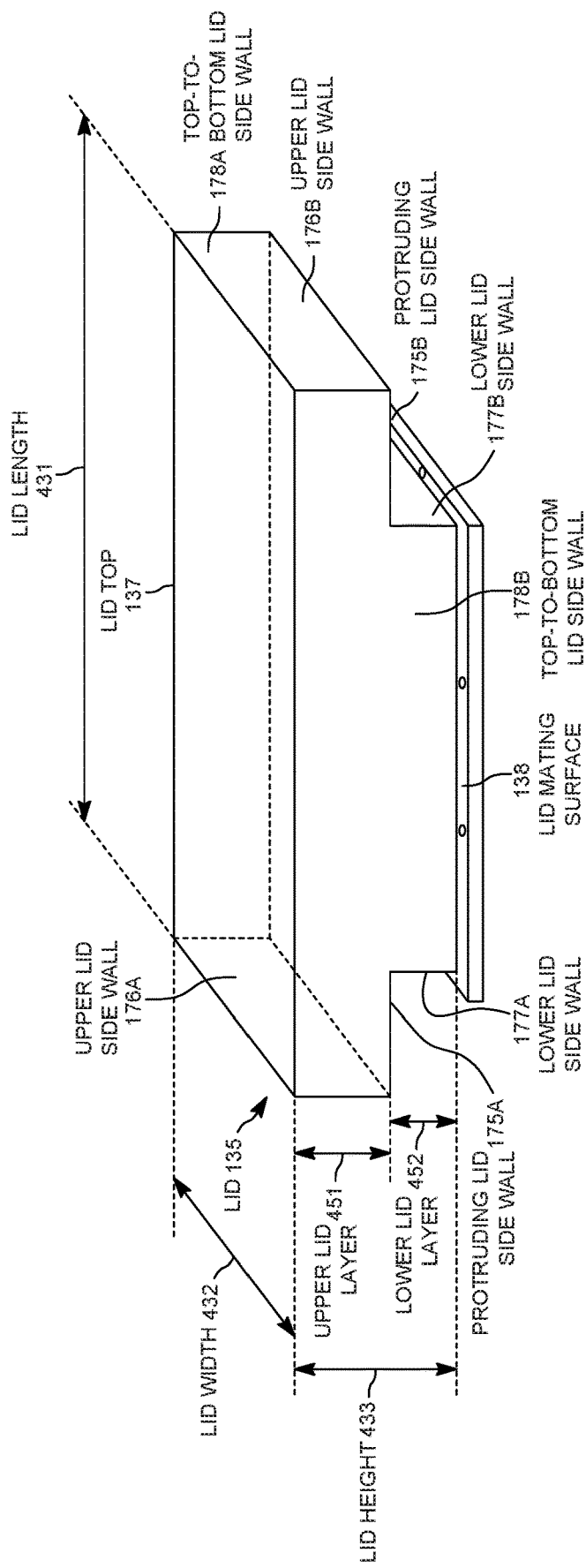
FIG. 4 is a front perspective view of the lid of the electronics equipment enclosure of FIGS. 1-2 depicting two protruding lid side walls.

FIG. 4 is a front perspective view of the lid of the electronics equipment enclosure 120 of FIGS. 1-2 depicting two protruding lid side walls 175A-B. Protruding lid side walls 175A is positioned on lid short side 291 and protruding lid side wall 175B is positioned on lid short side 292. As shown, the at least one lid side wall includes a set of lid side walls (elements 175A-B, 176A-B, 177A-B, 178A-B). In FIG. 4, the set of lid side walls includes two lower lid side walls 177A-B. Each of the lower lid side walls 177A-B intersects the lid mating surface 138 and extends upwards from the lid mating surface 138. In FIG. 4, the set of lid side walls further includes two upper lid side walls 176A-B.

Each of the upper lid side walls 176A-B intersects the lid top 137 and extends downwards from outer boundaries of the lid top 137. Each of the protruding lid side walls 175A-B abuts a respective lower lid side wall 177A-B and extends outwards to project beyond the respective lower lid side wall 177A-B. Hence, as shown, each of the protruding lid side walls 175A-B and the respective lower lid side wall 177A-B form an L-shape. Additionally, each of the protruding lid side walls 175A-B and the respective upper lid side wall 176A-B form an L-shape.

Each of the protruding lid side walls 175A-B is flat, slopes upwards, or curves upwards from outer boundaries of the respective lower lid side wall 177A-B where the protruding lid side wall 175A-B abuts the respective lower lid side wall 177A-B. Each of the protruding lid side walls 175A-B projects inwards from outer boundaries of the respective upper lid side wall 176A-B where the protruding lid side wall 175A-B abuts the upper lid side wall 176A-B.

As further shown, the set of lid side walls further include at least one top-to-bottom lid side wall, and two top-to-bottom lid side walls 178A-B are shown in FIG. 4. Top-to-bottom side wall 178A is on lid hinge side 239 and top-to-bottom side wall 178B is on lid front side 238. Each of the top-to-bottom lid side walls 178A-B intersects outer boundaries of the lid top 137 and extends downwards from outer boundaries of the lid top 137 to intersect the lid mating surface 138. In the example of FIG. 4, a surface contour of each of the top-to-bottom lid side walls 178A-B has a T-shape.

In the example of FIG. 4, lid 135 includes an upper lid layer 451 and a lower lid layer 452 that are fastened together. In a first example, lower lid layer 451 is formed as a first integral piece (e.g., molded) that includes the lid mating surface 138 and the lower lid side walls 177A-B. Upper lid layer is then formed as a second integral piece (e.g., molded) that includes the protruding lid side walls 175A-B, the upper lid side walls 176A-B, and the lid top 137. In a second example, the lower lid layer 451 is formed as a first integral piece (e.g., molded) that includes the lid mating surface 138, the lower lid side walls 177A-B, and the protruding lid side walls 175A-B. Upper lid layer 452 is then formed as a second integral piece (e.g., molded) that includes the upper lid side walls 176A-B and the lid top 137.

Lid top 137, the set of lid side walls (elements 175A-B, 176A-B, 177A-B, 178A-B), and the lid mating surface 138 define a lid surface area and a lid volume of lid interior space 180 of the lid 135. Base bottom 142, the set of base side walls 141A-D, and the base mating surface 143 define a base surface area of base 140 and a base volume of base interior space 185. The lid surface area is greater than the base surface area. Additionally, the lid volume of the lid interior space 180 is greater than the base volume of the base interior space 185.

In an example, a highly conductive material forms each of the protruding lid side walls 175A-B, as well as other components of the lid 135 and the base 140. The highly conductive material forming the protruding lid side walls 175A-B, other components of the lid 135, and the base 140 may include aluminum, copper, steel, other suitable metal, or a combination thereof. The highly conductive material forms a heat sink on each of the protruding lid side walls 175A-B including one or more fins like that shown on the lid top 137 of FIG. 2. Heat sink is a passive heat exchanger that dissipates or transfers excessive or unwanted heat (thermal energy) by thermal conduction to air outside the electronics equipment enclosure 120. Highly conductive materials can include metals, electrolytes, superconductors, semiconductors, plasmas and some nonmetallic conductors, such as graphite and conductive polymers. Copper has a high conductivity. Annealed copper is the international standard to which all other electrical conductors are compared. The International Annealed Copper Standard (IACS) conductivity is 58 MS/m, although ultra-pure copper can slightly exceed 101% IACS. Silver is 6% more conductive than copper, but due to cost it is not practical in most cases. Aluminum is 61% of the conductivity of copper by cross-sectional area, but its lower density makes it twice as conductive by mass. Because aluminum is roughly one-third the cost of copper by weight, the economic advantages are considerable when large conductors are required.

Figure 5:
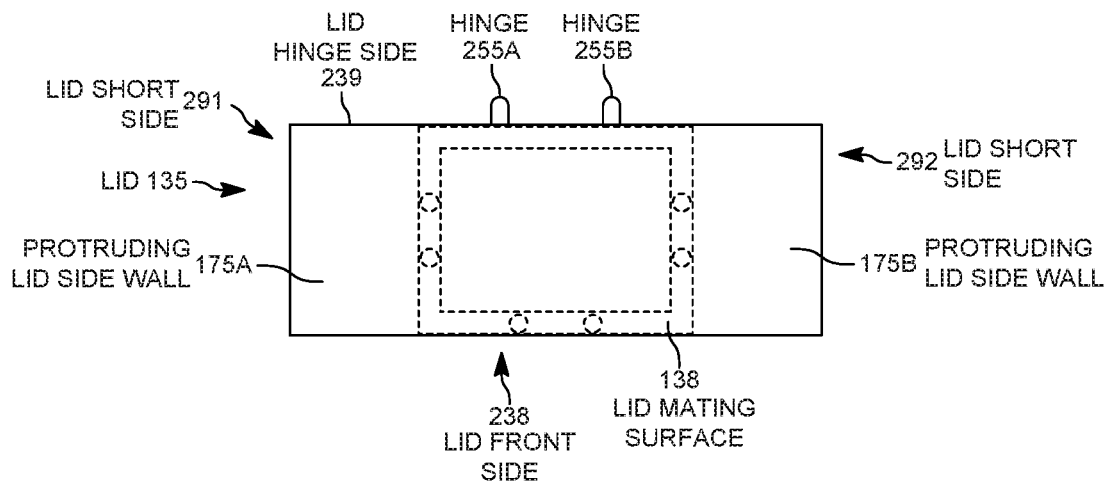
FIG. 5 is a top view of the lid of FIG. 4 depicting two protruding lid side walls, a lid front side of a lid mating surface, and a lid hinge side of the lid mating surface.

As shown in FIGS. 3-5, a lid height 433 of the lid 135 that spans distance from the lid mating surface 138 upwards to the lid top 137 is greater than the base height 348 of the base 140 that spans distance from the base mating surface 143 downwards to the base bottom 142. A lid length 431 of the lid 135 that spans distance from the at least one protruding lid side wall 175A that projects beyond the lid mating surface 138 to an opposing short side of the lid mating surface 138 is greater than the base length 346 that spans distance from two opposing short sides of the base mating surface 143.

FIG. 5 is a top view of the lid 135 of FIG. 4 depicting the two protruding lid side walls 175A-B. As further shown and previously described in FIG. 2, lid 135 includes lid front side 238 and lid hinge side 239 which include respective portions of lid mating surface 138. In particular, each of lid front side 238 and lid hinge side 239 include an opposing long side of lid mating surface 138. Hinges 255A-B are located on lid hinge side 239 and base hinge side 244 to connect and link (e.g., fasten) the lid hinge side 239 to base hinge side 244 to provide a movable joint or mechanism on which lid 135 swings as it opens and closes electronics equipment enclosure 120. This allows servicing of fiber optic node 120 by an HFC network technician.

Figure 6:
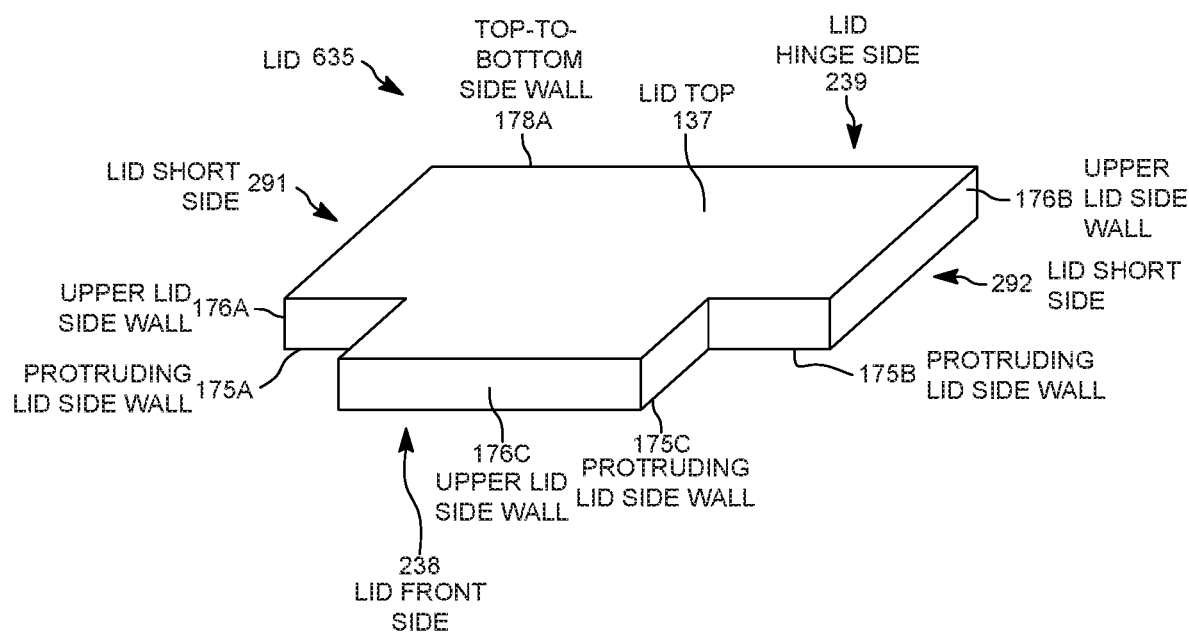
FIG. 6 is a front perspective view of another lid for the electronics equipment enclosure of FIGS. 1-2 depicting three protruding lid side walls.
Figure 7:
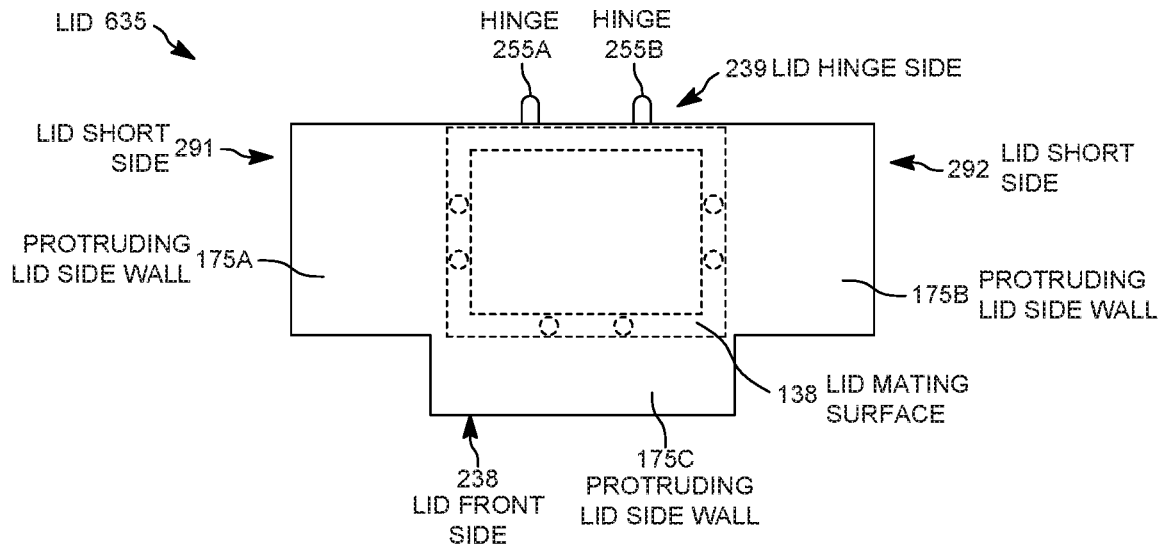
FIG. 7 is a top view of the lid of FIG. 6 for the electronics equipment enclosure of FIGS. 1-2 also depicting the three protruding lid side walls.

FIG. 6 is a front perspective view of another lid 635 for the electronics equipment enclosure 120 of FIGS. 1-2 depicting three protruding lid side walls 175A-C to increase the heat sink surface area to increase heat dissipation from electronics equipment enclosure 120 and to increase lid interior space 180 compared to lid 135. FIG. 7 is a top view of the lid 635 of FIG. 6 for the electronics equipment enclosure 120 of FIGS. 1-2 also depicting the three protruding lid side walls 175A-C. Lid 635 is similar to lid 135, but the set of lid side walls of lid 635 includes a third protruding lid side wall 175C, upper lid side wall 176C, and lower lid side wall 177C on lid front side 238. In contrast, in FIG. 4, lid 135 includes a second top-to-bottom side wall 178B on lid front side 238 of lid 135. But in FIGS. 6-7, lid 635 includes a single top-to-bottom side wall 178A on lid hinge side 239.

A surface contour of protruding lid side wall 175C is like that of protruding lid side walls 175A-B, as described previously with respect to lid 135. Also, the abutment and intersection of protruding lid side wall 175C with upper lid side wall 176C and lower lid side wall 177C is like that of protruding lid side walls 175A-B with respective upper lid side walls 176A-B and respective lower lid side walls 177A-B, as described previously. Hence, lower lid side wall 177C intersects the lid mating surface 138 and extends upwards from the lid mating surface 138. Upper lid side wall 176C intersects the lid top 137 and extends downwards from outer boundaries of the lid top 137. Protruding lid side wall 175C abuts the lower lid side wall 177C and extends outwards to project beyond the lower lid side wall 177C. Protruding lid side wall 175C is flat, slopes upwards, or curves upwards from outer boundaries of the lower lid side wall 177C where the protruding lid side wall 175C abuts the lower lid side wall 177C. Protruding lid side wall 175C projects inwards from outer boundaries of the upper lid side wall 176C where the protruding lid side wall 175C abuts the upper lid side wall 176C. In FIGS. 6-7, the lid width 432 (not shown) of the lid 635 that spans distance from the at least one protruding lid side wall 175C that projects beyond the lid mating surface 138 to an opposing long side of the lid mating surface 138 is greater than the base width 347 that spans distance from two opposing long sides of the base mating surface 143.

Figure 8:
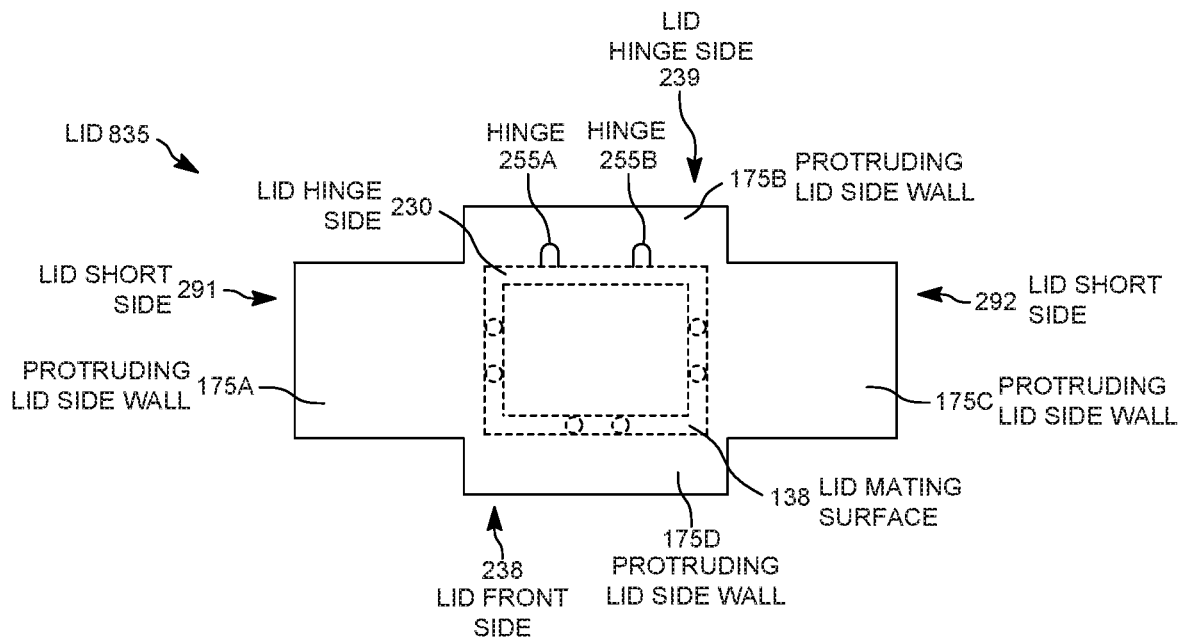
FIG. 8 is a top view of another lid for the electronics equipment enclosure of FIGS. 1-2 depicting four protruding lid side walls.

FIG. 8 is a top view of another lid 835 for the electronics equipment enclosure 120 of FIGS. 1-2 depicting four protruding lid side walls 175A-D to maximize the heat sink surface area to increase heat dissipation from electronics equipment enclosure 120 and to increase lid interior space 180 compared to both lid 135 and lid 635. Lid 835 is similar to lid 635, but the set of lid side walls of lid 635 includes a fourth protruding lid side wall 175D, upper lid side wall 176D, and lower lid side wall 177D on lid hinge side 239. Lid 135 includes two top-to-bottom side walls 178A-B on lid front side 238 and lid hinge side 239, respectively. Lid 635 includes a single top-to-bottom side wall 178A on lid hinge side 239. But in FIG. 8, lid 835 includes zero top-to-bottom side walls.

A surface contour of protruding lid side wall 175D is like that of protruding lid side walls 175A-C, as described previously with respect to lid 135 and lid 635 Also, the abutment and intersection of protruding lid side wall 175D with upper lid side wall 176D (not shown) and lower lid side wall 177C (not shown) is like that of protruding lid side walls 175A-C with respective upper lid side walls 176A-C and respective lower lid side walls 177A-C, as described previously. Hence, lower lid side wall 177D (not shown) intersects the lid mating surface 138 and extends upwards from the lid mating surface 138. Upper lid side wall 176D (not shown) intersects the lid top 137 and extends downwards from outer boundaries of the lid top 137. Protruding lid side wall 175D abuts the lower lid side wall 177D (not shown) and extends outwards to project beyond the lower lid side wall 177D. Protruding lid side wall 175D is flat, slopes upwards, or curves upwards from outer boundaries of the lower lid side wall 177D (not shown) where the protruding lid side wall 175D abuts the lower lid side wall 177D (not shown). Protruding lid side wall 175D projects inwards from outer boundaries of the upper lid side wall 176D (not shown) where the protruding lid side wall 175D abuts the upper lid side wall 176D (not shown).

Figure 9A:
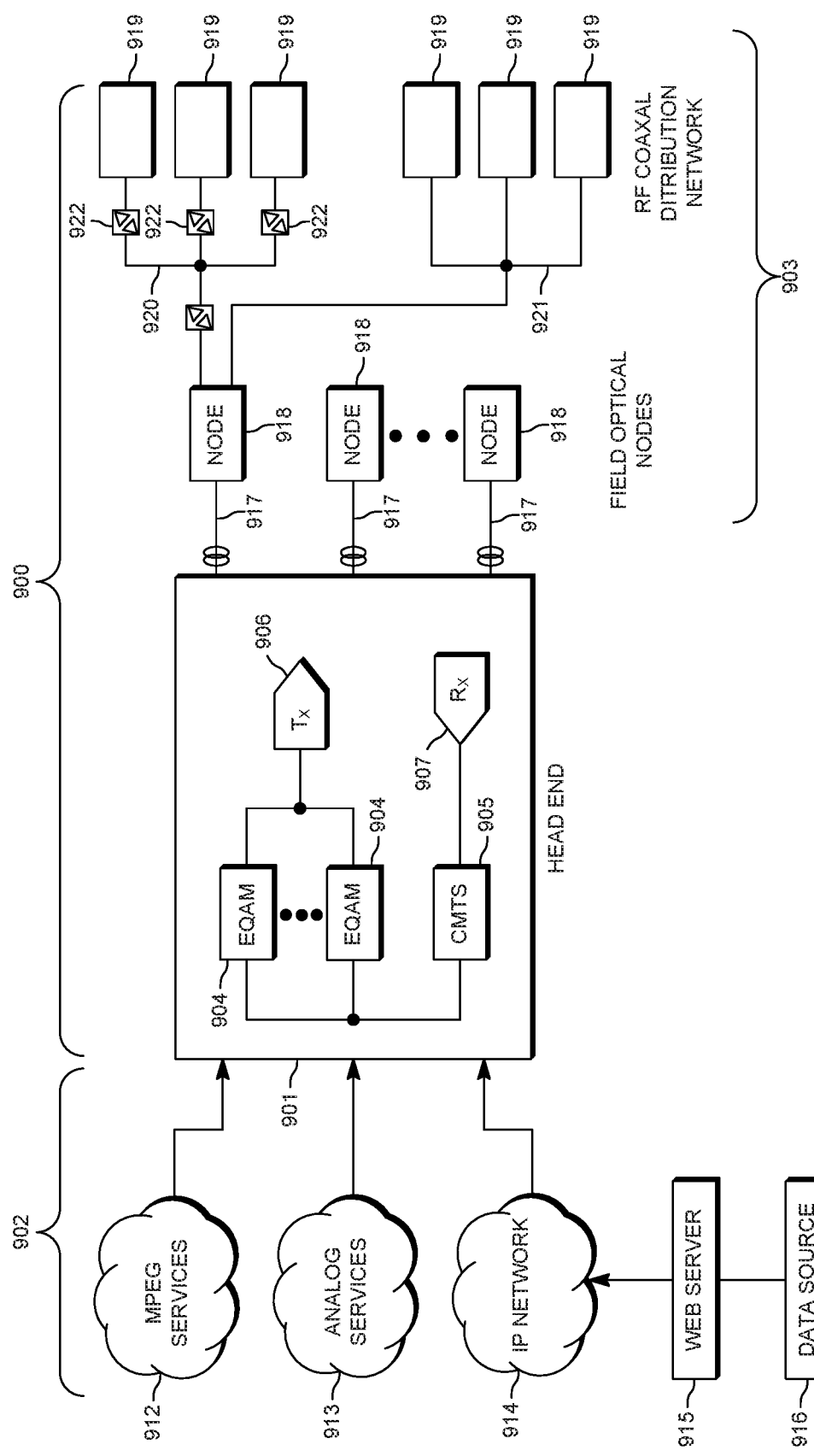
FIG. 9A is a block diagram of a hybrid fiber-coaxial system block, showing a high-level view of how various data streams traverse an HFC system to ultimately arrive at the consumer.

FIG. 9A shows an exemplary cable television (CATV) system 900 operable to deliver high-definition digital entertainment and telecommunications such as video, voice, and high-speed Internet services. Generally speaking, the CATV system 900 refers to the operational (e.g., geographical) footprint of an entertainment and/or information services franchise that provides entertainment and/or information services to a subscriber base spanning one or more towns, a region, or a portion thereof. Particular entertainment and/or information services offered by the franchise (e.g., entertainment channel lineup, data packages, etc.) may differ from system to system. Some large cable companies operate several cable communication systems (e.g., in some cases up to hundreds of systems), and are known generally as Multiple System Operators (MSOs).

The cable network can take the form of an all-coax, all-fiber, or hybrid fiber/coax (HFC) network, e.g., fiber to the last amplifier (FTTA). For purposes of illustration only, FIG. 9A depicts a hybrid fiber-coaxial (HFC) network. An HFC network is a broadband network that combines optical fiber and coaxial cable, strategically placing fiber nodes to provide services to a plurality of homes. It should be understood that the systems and methods disclosed in the present application may be employed in various networks and the HFC network is merely shown as a non-limiting example.

The network shown in FIG. 9A is an HFC broadband network that combines the use of optical fiber and coaxial connections. The network includes a head end 901 that receives analog video signals and digital bit streams representing different services (e.g., video, voice, and Internet) from various digital information sources. For example, the head end 901 may receive content from one or more video on demand (VOD) servers, IPTV broadcast video servers, Internet video sources, or other suitable sources for providing IP content.

An IP network 914 may include a web server 915 and a data source 916. The web server 915 is a streaming server that uses the IP protocol to deliver video-on-demand, audio-on-demand, and pay-per view streams to the IP network 914. The IP data source 916 may be connected to a regional area or backbone network (not shown) that transmits IP content. For example, the regional area network can be or include the Internet or an IP-based network, a computer network, a web-based network or other suitable wired or wireless network or network system.

At the head end 901, the various services are encoded, modulated and up-converted onto RF carriers, combined onto a single electrical signal and inserted into a broadband optical transmitter. A fiber optic network extends from the cable operator's master/regional head end 901 to a plurality of fiber optic nodes 918. The head end 901 may contain an optical transmitter or transceiver to provide optical communications through optical fibers 917. Regional head ends and/or neighborhood hub sites may also exist between the head end and one or more nodes. The fiber optic portion of the example HFC network 900 extends from the head end 901 to the regional head end/hub and/or to a plurality of nodes 918. The optical transmitter converts the electrical signal to a downstream optically modulated signal that is sent to the nodes. In turn, the optical nodes convert inbound signals to RF energy and return RF signals to optical signals along a return path. In the specification, the drawings, and the claims, the terms "forward path" and "downstream" may be interchangeably used to refer to a path from a head end to a node, a node to a subscriber, or a head end to a subscriber. Conversely, the terms "return path", "reverse path" and "upstream" may be interchangeably used to refer to a path from a subscriber to a node, a node to a head end, or a subscriber to a head end. Also, in the specification, in the drawings, and the claims a node may be any digital hub between a head end and a customer home that transports local requests over the CATV network. Forward path optical communications over the optical fiber may be converted at the nodes to Radio Frequency (RF) communications for transmission over the coaxial cable to the subscribers. Conversely, return path RF communications from the subscribers are provided over coaxial cables and are typically converted at a node to optical signals for transmission over the optical fiber to the head end. Each node 918 may contain a return path transmitter that is able to relay communications upstream from a subscriber device 919 to the head end 901.

Each node 918 serves a service group comprising one or more customer locations. By way of example, a single node 918 may be connected to thousands of cable modems or other subscriber devices 919. In an example, a fiber node may serve between one and two thousand or more customer locations. In an HFC network, the fiber optic node 918 may be connected to a plurality of subscriber devices 919 via coaxial cable cascade 922, though those of ordinary skill in the art will appreciate that the coaxial cascade may comprise a combination of RF amplifiers, taps & splitters and coaxial cable. In some implementations, each node 918 may include a broadband optical receiver to convert the downstream optically modulated signal received from the head end or a hub to an electrical signal provided to the subscribers' devices 919 through the coaxial cascade 922. Signals may pass from the node 918 to the subscriber devices 919 via the RF cascade 922, which may be comprised of multiple amplifiers and active or passive devices including cabling, taps, splitters, and in-line equalizers. It should be understood that the amplifiers in the RF cascade 922 may be bidirectional, and may be cascaded such that an amplifier may not only feed an amplifier further along in the cascade but may also feed a large number of subscribers. The tap is the customer's drop interface to the coaxial system. Taps are designed in various values to allow amplitude consistency along the distribution system.

The subscriber devices 919 may reside at a customer location, such as a home of a cable subscriber, and are connected to the cable modem termination system (CMTS) 905 or comparable component located in a head end. A client device 919 may be a modem, e.g., cable modem, MTA (media terminal adaptor), set top box, terminal device, television equipped with set top box, Data Over Cable Service Interface Specification (DOCSIS) terminal device, customer premises equipment (CPE), router, or similar electronic client, end, or terminal devices of subscribers. For example, cable modems and IP set top boxes may support data connection to the Internet and other computer networks via the cable network, and the cable network provides bi-directional communication systems in which data can be sent downstream from the head end to a subscriber and upstream from a subscriber to the head end.

The techniques disclosed herein may be applied to systems compliant with DOCSIS. The cable industry developed the international Data Over Cable System Interface Specification (DOCSIS®) standard or protocol to enable the delivery of IP data packets over cable systems. In general, DOCSIS defines the communications and operations support interface requirements for a data over cable system. For example, DOCIS defines the interface requirements for cable modems involved in high-speed data distribution over cable television system networks. However, it should be understood that the techniques disclosed herein may apply to any system for digital services transmission, such as digital video or Ethernet PON over Coax (EPoc). Examples herein referring to DOCSIS are illustrative and representative of the application of the techniques to a broad range of services carried over coax.

References are made in the present disclosure to a Cable Modem Termination System (CMTS) in the head end 901. In general, the CMTS is a component located at the head end or hub site of the network that exchanges signals between the head end and client devices within the cable network infrastructure. In an example DOCSIS arrangement, for example, the CMTS and the cable modem may be the endpoints of the DOCSIS protocol, with the hybrid fiber coax (HFC) cable plant transmitting information between these endpoints. It will be appreciated that architecture 100 includes one CMTS for illustrative purposes only, as it is in fact customary that multiple CMTSs and their Cable Modems are managed through the management network.

The CMTS 905 hosts downstream and upstream ports and contains numerous receivers, each receiver handling communications between hundreds of end user network elements connected to the broadband network. For example, each CMTS 905 may be connected to several modems of many subscribers, e.g., a single CMTS may be connected to hundreds of modems that vary widely in communication characteristics. In many instances several nodes, such as fiber optic nodes 918, may serve a particular area of a town or city. DOCSIS enables IP packets to pass between devices on either side of the link between the CMTS and the cable modem. It should be understood that the CMTS is a non-limiting example of a component in the cable network that may be used to exchange signals between the head end and subscriber devices 919 within the cable network infrastructure. For example, other non-limiting examples include a Modular CMTS (M-CMTSTM) architecture or a Converged Cable Access Platform (CCAP).

An EdgeQAM (EQAM) 904 or EQAM modulator may be in the head end or hub device for receiving packets of digital content, such as video or data, re-packetizing the digital content into an MPEG transport stream, and digitally modulating the digital transport stream onto a downstream RF carrier using Quadrature Amplitude Modulation (QAM). EdgeQAMs may be used for both digital broadcast, and DOCSIS downstream transmission. In CMTS or M-CMTS implementations, data and video QAMs may be implemented on separately managed and controlled platforms. In CCAP implementations, the CMTS and edge QAM functionality may be combined in one hardware solution, thereby combining data and video delivery.

Orthogonal frequency-division multiplexing (OFDM) may utilize smaller sub-bands (compared to QAM carriers). For example, while a conventional DOCSIS QAM carrier is 6 MHz wide, the CATV system may employ orthogonal frequency division multiplexing (OFDM) technology with OFDM carriers that are approximately 25 kHz to 50 kHz wide. Thus, where previously 100 QAM carriers were used, thousands of OFDM subcarriers may be used. OFDM technology may be suitable for noisy signal conditions and may enable use of more of the available spectrum without reducing the quality of server. In example implementations, a cable network may use the QAM modulation for downstream speeds and boost upstream speeds using OFDM.

Figure 9B:
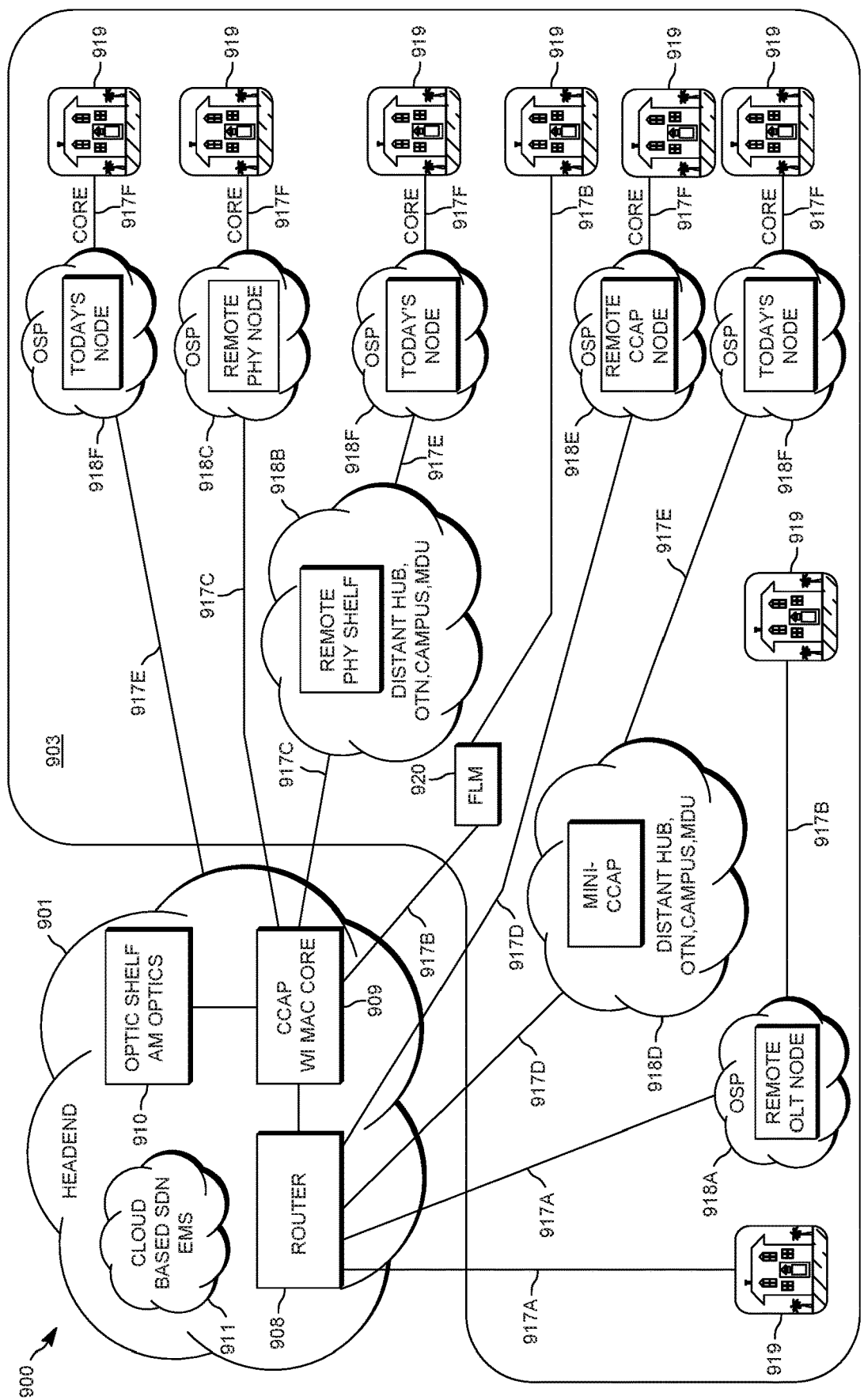
FIG. 9B is a diagram detailing portions of FIG. 9A: specifically, it details the variety of technologies that will potentially benefit from the technology disclosed in this application.

FIG. 9B is a diagram emphasizing the various technologies that can be implemented in a CATV system 900. In this diagram, the head end 901 includes a router 908, which receives Ethernet signals from one or more of the input services 901 in FIG. 9A, and sends out Ethernet signals to various receivers. The head end 901 also includes a Converged Cable Access Platform (CCAP) with a Media Access Control (MAC) core 909 connected to the router 908, which receives Ethernet signals from the router 908 and outputs various digital signals 917 to various receivers. The head end 901 additionally includes an Optic Shelf 910 connected to the CCAP with MAC 909 for converting digital signals from the CCAP with MAC 909 to analog signals for various receivers. The head end 901 further contains a Cloud-based Software Defined Network Element Measurement System (SDN EMS) 911, which can either monitor and manage the network programmatically, or provide mechanisms for an operator to monitor and manage the network. The head end 901 connects to various nodes 918 and subscriber devices 919 via connections 917 in the "Last Mile" connection area 903. For example, a subscriber device 919 directly connecting to the router 908 via an Ethernet Digital Fiber connection 917A. As another example, subscriber device 919 connecting via a 10G Private Dedicated Network (PDN) Digital Fiber connection 917B to a remote Optical Line Terminal (OLT) node 918A capable of converting Ethernet signals to 10G Ethernet signals, which connects to the router 908 via a Ethernet digital fiber connection 917A. As a third example, a subscriber device 919 connecting via Coaxial cable 917F to a typical contemporary node 918F capable of converting analog fiber signals to coaxial signals, which connects to a Mini-CCAP 918D capable of converting R-CCAP digital signals to analog fiber signals via an analog fiber connection 917E, which connects to the router 908 via a R-CCAP digital fiber connection 917D.

An additional example shows a subscriber device 919 connecting via 917F Coaxial cable 919 to a remote CCAP node 918E capable of converting R-CCAP digital signals to coaxial signals, which connects to the router 908 via a R-CCAP 917D digital fiber connection. A further example describes a subscriber device 919 connecting via 10G PDN 917B to a Fiber Link Module (FLM) 920 capable of boosting digital fiber connections, which connects to the CCAP with MAC core 909 via a 10G PDN connection 917B. Yet another example details a subscriber device 919 connecting via Coaxial cable 917F to a typical contemporary node 918F, which connects to a remote Physical Layer (PHY) node 918B capable of converting R-PHY digital signals to analog fiber signals, which connects to the CCAP with MAC core 909 via a R-PHY digital connection 917C. Additionally, the diagram displays a subscriber device 919 connecting via Coaxial cable 917F to a remote PHY node 918C capable of converting R-PHY digital signals to coaxial signals, which connects to the CCAP with MAC core 909 via a R-PHY digital connection 917C. Finally, this figure details a subscriber device 919 connecting via Coaxial cable 917F to a typical contemporary node 918F, which connects to the Optic shelf 910 via an analog fiber connection 917E.

Figure 10:
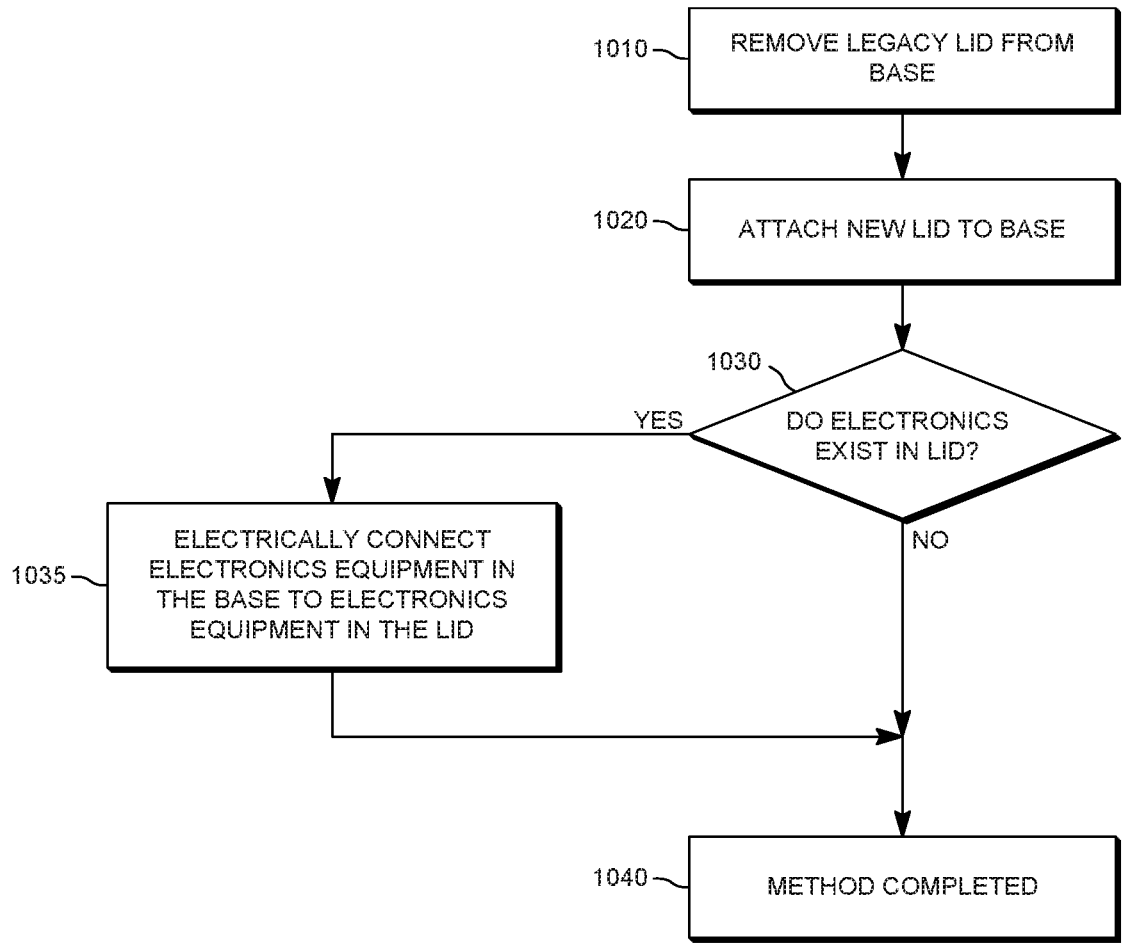
FIG. 10 is a flow chart describing the manual process for upgrading a node lid.

FIG. 10 is a flow chart describing the typical process for a technician performing an upgrade as described by this application on an average node, for example, in a method of installing a new lid on an electronics equipment enclosure include. At Step 1010, the technician disconnects and removes the existing legacy lid from the base of the node, careful to not interrupt or unduly disconnect any cables or connections in the base of the node. The technician removes a legacy lid attached to a base of an electronics equipment enclosure while the base remains connected to a cable, the base including previously installed electronics equipment disposed therein.

The technician then performs Step 1020 and attaches the new lid to the base of the existing node. Thus, the technician attaches the new lid to the base of the electronics equipment enclosure while the base of the electronics equipment enclosure remains connected to a cable. The new lid includes a lid top and a lid mating surface to contact and overlap a base mating surface of the base to close the electronics equipment enclosure. The new lid includes at least one lid side wall extending away from the lid top. The at least one lid side wall includes at least one protruding lid side wall extending outwards to project beyond the lid mating surface. The new lid further includes an interior space defined by the lid top, the at least one lid side wall, and the lid mating surface and new electronics equipment mounted in the interior space. The new lid includes an expanded lid surface area and lid volume compared to the legacy lid In Decision 1030, the technician discerns whether there are electronics in the new lid. If there are electronics in the new lid, the technician proceeds to Step 1035, and connects the electronics in the new lid to the electronics already in-place in the base of the node. Thus, the technician electrically connects the new electronics equipment to the previously installed electronics equipment of the base. Finally, whether or not Step 1035 was performed, the process is complete at Step 1040.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it may be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A fiber optic node comprising:
an electronics equipment enclosure including a lid and a base defining an overall interior space of the electronics equipment enclosure, with connectors extending from the base; and
an optical transceiver mounted within the overall interior space of the electronics equipment enclosure;
wherein the lid includes:
a lid top;
a lid mating surface to contact and overlap a base mating surface of the base to close the electronics equipment enclosure; and
at least one lid side wall extending away from the lid top, the at least one lid side wall including at least one protruding lid side wall extending outwards to project beyond the lid mating surface to extend laterally beyond the connectors that extend from the base;
the lid top, the at least one lid side wall, and the lid mating surface define a lid interior space of the lid; and
the base includes:
a base bottom;
at least one base side wall extending away from the base bottom; and
the base mating surface to contact and overlap the lid mating surface of the lid to close the electronics equipment enclosure;
the base bottom, the at least one base side wall, and the base mating surface define a base interior space of the base; and
the lid interior space is greater than the base interior space.

2. The fiber optic node of claim 1, wherein:
the base has a cuboid polyhedron shape;
the at least one base side wall includes a set of base side walls; and
the set of base side walls includes four quadrilateral base side walls.

3. The fiber optic node of claim 2, wherein:
the lid mating surface and the base mating surface are quadrilateral surfaces;
the lid has a non-cuboid shaped polyhedron shape.

4. The fiber optic node of claim 2, wherein:
the at least one lid side wall includes a set of lid side walls, the set of lid side walls including:
a lower lid side wall which intersects the lid mating surface and extends upwards from the lid mating surface;
an upper lid side wall which intersects the lid top and extends downwards from outer boundaries of the lid top; and
the protruding lid side wall abuts the lower lid side wall and extends outwards to project beyond the lower lid side wall.

5. The fiber optic node of claim 4, wherein the protruding lid side wall is flat, slopes upwards, or curves upwards from outer boundaries of the lower lid side wall where the protruding lid side wall abuts the lower lid side wall.

6. The fiber optic node of claim 5, wherein the protruding lid side wall projects inwards from outer boundaries of the upper lid side wall where the protruding lid side wall abuts the upper lid side wall.

7. The fiber optic node of claim 6, wherein the set of lid side walls further include at least one top-to-bottom lid side wall which intersects outer boundaries of the lid top and extends downwards from outer boundaries of the lid top to intersect the lid mating surface.

8. The fiber optic node of claim 6, wherein a surface contour of the at least one top-to-bottom lid side wall has a T-shape.

9. The fiber optic node of claim 4, wherein:
the lid includes an upper lid layer and a lower lid layer that are fastened together;
the lower lid layer is formed as a first integral piece that includes the lid mating surface and the lower lid side wall; and the upper lid layer is formed as a second integral piece that includes the protruding lid side wall, the upper lid side wall, and the lid top.

10. The fiber optic node of claim 4, wherein:
the lid includes an upper lid layer and a lower lid layer that are fastened together;
the lower lid layer is formed as a first integral piece that includes the lid mating surface, the lower lid side wall, and the protruding lid side wall; and
the upper lid layer is formed as a second integral piece that includes the upper lid side wall and the lid top.

11. The fiber optic node of claim 4, wherein:
the lid top, the set of lid side walls, and the lid mating surface define a lid surface area of the lid;
the base bottom, the set of base side walls, and the base mating surface define a base surface area of the base; and
the lid surface area is greater than the base surface area.

12. The fiber optic node of claim 11, wherein:
a highly conductive material forms the protruding lid side wall;
the highly conductive material includes copper, aluminum, or a combination thereof; and
the highly conductive material forms a heat sink on the protruding lid side wall including one or more fins.

13. The fiber optic node of claim 4, wherein a lid height of the lid that spans distance from the lid mating surface upwards to the lid top is greater than a base height of the base that spans distance from the base mating surface downwards to the base bottom.

14. The fiber optic node of claim 4, wherein a lid length of the lid that spans distance from the at least one protruding lid side wall that projects beyond the lid mating surface to an opposing short side of the lid mating surface is greater than a base length that spans distance from two opposing short sides of the base mating surface.

15. The fiber optic node of claim 4, wherein a lid width of the lid that spans distance from the at least one protruding lid side wall that projects beyond the lid mating surface to an opposing long side of the lid mating surface is greater than a base width that spans distance from two opposing long sides of the base mating surface.

16. The fiber optic node of claim 1, further comprising electrical or electronics equipment mounted inside the lid interior space of the lid.

17. The fiber optic node of claim 1, when the optical transceiver is disposed inside the lid and includes:
an optical transmitter mounted within the lid interior space of the electronics equipment enclosure to convert electrical signals conveyed via a coaxial cable into optical signals for upstream transmission via a fiber optic cable; and
an optical receiver mounted within the lid interior space of the electronics equipment enclosure to convert optical signals conveyed via the fiber optic cable into electrical signals for downstream transmission via the coaxial cable.

18. A fiber optic node enclosure comprising:
a lid and a base defining an overall interior space of the electronics equipment enclosure, with connectors extending from the base; and
wherein the lid includes:
a lid top;
a lid mating surface to contact and overlap a base mating surface of the base to close the electronics equipment enclosure; and
at least one lid side wall extending away from the lid top, the at least one lid side wall including at least one protruding lid side wall extending outwards to project beyond the lid mating surface to extend laterally beyond the connectors that extend from the base;
the base includes:
a base bottom;
at least one base side wall extending away from the base bottom; and
the base mating surface to contact and overlap the lid mating surface of the lid to close the electronics equipment enclosure.

19. A fiber optic node comprising:
an electronics equipment enclosure including a lid and a base defining an overall interior space of the electronics equipment enclosure, with connectors extending from the base; and
electronics equipment mounted within the interior space of the electronics equipment enclosure wherein:
the lid includes:
a lid top;
a lid mating surface to contact and overlap a base mating surface of the base to close the electronics equipment enclosure; and
at least one lid side wall extending away from the lid top, the at least one lid side wall including at least one protruding lid side wall extending outwards to project beyond the lid mating surface to extend laterally beyond the connectors that extend from the base;
the base includes:
a base bottom;
at least one base side wall extending away from the base bottom; and
the base mating surface to contact and overlap the lid mating surface of the lid to close the electronics equipment enclosure.

20. The fiber optic node of claim 19, wherein:
the base has a cuboid polyhedron shape;
the at least one base side wall includes a set of base side walls;
the set of base side walls includes four quadrilateral base side walls;
the lid mating surface and the base mating surface are quadrilateral ring-shaped surfaces with rounded corners; and
the lid is a non-cuboid shaped polyhedron.

* * * * *